(12) United States Patent  (10) Patent No.: US 8,371,454 B2
Chen et al.  (45) Date of Patent: Feb. 12, 2013

(54) BRACKET ASSEMBLY FOR A RACK

(75) Inventors: Ken Ching Chen, Kaohsiung Hsien (TW); Shun Ho Yang, Kaohsiung Hsien (TW); Chien Li Huang, Kaohsiung Hsien (TW); Chun Chiang Wang, Kaohsiung Hsien (TW)

(73) Assignee: King Slide Works Co., Ltd., Kaohsing Hsien (TW)

( * ) Notice: Subject to any disclaimer, the term of this patent is extended or adjusted under 35 U.S.C. 154(b) by 539 days.

(21) Appl. No.: 12/558,766

(22) Filed: Sep. 14, 2009

(65) Prior Publication Data

US 2010/0072153 A1  Mar. 25, 2010

(30) Foreign Application Priority Data

Sep. 25, 2008  (TW) ................................ 97136995 A

(51) Int. Cl.
 A47F 7/00  (2006.01)
(52) U.S. Cl. ...................... 211/26; 312/334.4; 312/334.5
(58) Field of Classification Search .................. 211/183, 211/190, 192, 26, 26.2; 248/220.21, 220.31, 248/220.41, 221.11, 220.22, 201, 298.1; 384/22; 312/319.1, 334.4, 223.1, 265.1–265.4, 312/334.5, 334.1
See application file for complete search history.

(56) References Cited

U.S. PATENT DOCUMENTS

| | | | | |
|---|---|---|---|---|
| 5,695,265 A * | 12/1997 | Hoffman | ..................... | 312/334.5 |
| 6,554,142 B2 * | 4/2003 | Gray | ................................ | 211/26 |
| 6,659,577 B2 * | 12/2003 | Lauchner | .................... | 312/334.5 |
| 7,093,725 B2 * | 8/2006 | Hartman et al. | ................. | 211/26 |
| 7,144,184 B1 * | 12/2006 | Tsai | ................................ | 403/350 |
| 7,192,103 B2 * | 3/2007 | Hamilton | .................... | 312/334.5 |
| 7,284,672 B2 * | 10/2007 | Tsai | ................................ | 211/208 |
| 7,357,362 B2 * | 4/2008 | Yang et al. | ................ | 248/221.11 |
| 7,798,581 B2 * | 9/2010 | Chen et al. | ................. | 312/265.1 |
| 2004/0104184 A1 * | 6/2004 | Hartman et al. | ................. | 211/26 |
| 2005/0052102 A1 * | 3/2005 | Lauchner | .................... | 312/334.5 |
| 2005/0155941 A1 * | 7/2005 | Hartman et al. | ................. | 211/26 |
| 2005/0156493 A1 * | 7/2005 | Yang et al. | .................. | 312/334.5 |
| 2005/0189855 A1 * | 9/2005 | Naue et al. | .................. | 312/334.4 |
| 2005/0285492 A1 * | 12/2005 | Hu et al. | ..................... | 312/334.4 |
| 2008/0053933 A1 * | 3/2008 | Allen et al. | ................. | 211/90.01 |
| 2008/0067907 A1 * | 3/2008 | Chen et al. | ..................... | 312/312 |
| 2008/0078899 A1 * | 4/2008 | Chen et al. | ............... | 248/220.21 |
| 2008/0087781 A1 * | 4/2008 | Chen et al. | ................. | 248/224.8 |
| 2008/0203251 A1 * | 8/2008 | Chen et al. | ..................... | 248/200 |
| 2008/0303390 A1 * | 12/2008 | Hsiung et al. | ............... | 312/223.1 |
| 2009/0114785 A1 * | 5/2009 | Huang et al. | ............. | 248/220.31 |
| 2009/0166485 A1 * | 7/2009 | Chen et al. | ..................... | 248/200 |
| 2009/0167127 A1 * | 7/2009 | Chen et al. | .................... | 312/334.1 |
| 2009/0283652 A1 * | 11/2009 | Chen et al. | .................. | 248/298.1 |
| 2009/0294393 A1 * | 12/2009 | Chen et al. | ..................... | 211/175 |
| 2010/0200523 A1 * | 8/2010 | Henderson | ....................... | 211/26 |

* cited by examiner

*Primary Examiner* — Darnell M Jayne
*Assistant Examiner* — Patrick Hawn
(74) *Attorney, Agent, or Firm* — Rosenberg, Klein & Lee

(57) ABSTRACT

A bracket assembly for a rack is provided. The rack has a plurality of holes. The bracket assembly includes a bracket having multiple bracket holes, a base securely connected to the bracket, and a fastening member pivotally connected to the bracket. The base includes multiple connection members corresponding to the bracket holes. The fastening member includes a resilient leg and a fastening arm. The fastening arm has at least one fastening portion. One of the connection members is inserted into one of the holes of the rack. The fastening portion of the fastening arm is hooked to the rack so as to connect the bracket to the rack.

7 Claims, 17 Drawing Sheets

BRACKET ASSEMBLY FOR A RACK

FIELD OF THE INVENTION

The present invention relates to a bracket assembly, and more particularly, to a bracket assembly for a rack.

BACKGROUND OF THE INVENTION

A conventional bracket assembly for a rack is disclosed in U.S. Pat. No. 7,357,362, titled "Bracket Positioning Structure for a Slide" to Yang, and US Published Number 2003/0107309, titled "Dual Flat Springs for Tool-Less Slide Installation" to Lauchner. Lauchner discloses the use of two springs. The end of one spring leans on a frame of a rack. Yang discloses an arm having at least a toothed portion which is urged by a spring so as to engage with the frame.

The arm disclosed by Yang includes the toothed portion which is engaged with the frame, however, only the cross section of the toothed portion, a thickness of a board-like piece, is engaged with the frame. This can only provide a temporary positioning feature and the engagement is not strong enough especially when a heavy load is connected with the bracket.

SUMMARY OF THE INVENTION

The present invention relates to a bracket assembly, and the bracket assembly is reliable and strong enough to be mounted in a rack.

According to a first aspect of the present invention, there is provided a bracket assembly, comprising:

a bracket including a first plate and a second plate extending from an end of the first plate, the second plate having a plurality of bracket holes;

a base connected to the bracket, the base having a plurality of connection members, at least one of the connection members corresponding to at least one of the bracket holes; and a fastening member pivotally connected to the bracket, the fastening member including a resilient leg and a fastening arm extending from the fastening member, the fastening arm having at least one fastening portion, the fastening portion having a force to return its original position by the resilient leg.

Preferably, the bracket includes two lugs, the fastening member includes two spaced connection plates which have pivotal holes, and a pin extends through the lugs and the pivotal holes to connect the fastening member to the lugs.

Preferably, the bracket includes a first engaging portion extending from the first plate and the second plate includes two second engaging portions, the first engaging portion and the two second engaging portions of the bracket being adapted to position the base.

Preferably, each of the connection members of the base includes a protrusion, a mounting piece movably mounted to the protrusion and a spring disposed between the protrusion and the mounting piece, wherein the mounting piece has a through hole and the protrusion extends through the through hole.

Preferably, the base includes a first stop and a second stop, the resilient leg of the fastening member extending to the first stop of the base, the free end of the resilient leg leaning on the first stop, the fastening member including a contact part corresponding to the second stop of the base for limiting the operating angle of the fastening arm of the fastening member.

Preferably, the bracket includes a stop plate for the free end of the resilient leg of the fastening member to lean on the stop plate so as to provide a force to return the fastening member to its original position.

Preferably, the fastening member includes a contact part and the bracket includes a stop plate which extends to a position corresponding to the contact part of the fastening member for limiting the operating angle of the fastening arm of the fastening member.

Preferably, the resilient leg is selectively to lean on the bracket or the base.

Preferably, the bracket assembly further comprises a support frame assembly which includes a first support frame and a second support frame, the first support frame including a first support portion for connecting with a first extension plate, the second support frame being adapted to support a load member for movably connecting with a second extension plate, the second support frame including a stop member, the second extension plate including a first block and a second block which is spaced away from the first block, the stop member being located between the first and second blocks and stopped by one of the first and second blocks for restricting the travel distance of the second extension plate relative to the second support frame.

Preferably, the first and second support frames each have a C-shaped cross section and are connected back to back to each other.

According to a second aspect of the present invention, there is provided a combination of a rack and a bracket assembly, wherein the rack includes a plurality of posts and at least a pair of support frame assemblies, each of the posts having a plurality of holes, each of the support frame assembly including a first support frame and a second support frame, the first support frame being fixed to a first extension plate and the second support frame being movably connected to a second extension plate, the first and second extension plates being respectively connected to the bracket assembly, the bracket assembly comprising:

a bracket having a plurality of bracket holes;

a base connected to the bracket, the base including a plurality of connection members, at least one of the connection members corresponding to at least one of the bracket holes; and a fastening member pivotally connected to the bracket, the fastening member including a resilient leg and a fastening arm extending from the fastening member, the fastening arm having at least one fastening portion which bends from the fastening arm, the fastening portion extending beyond the bracket, the resilient leg including a fixing end fixed to the fastening member and a free end leaning on the bracket or the base;

wherein at least one of the connection members of the base is connected to at least one of the holes of the rack;

wherein the fastening portion of the fastening arm of the fastening member is hooked to one of the posts of the rack.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
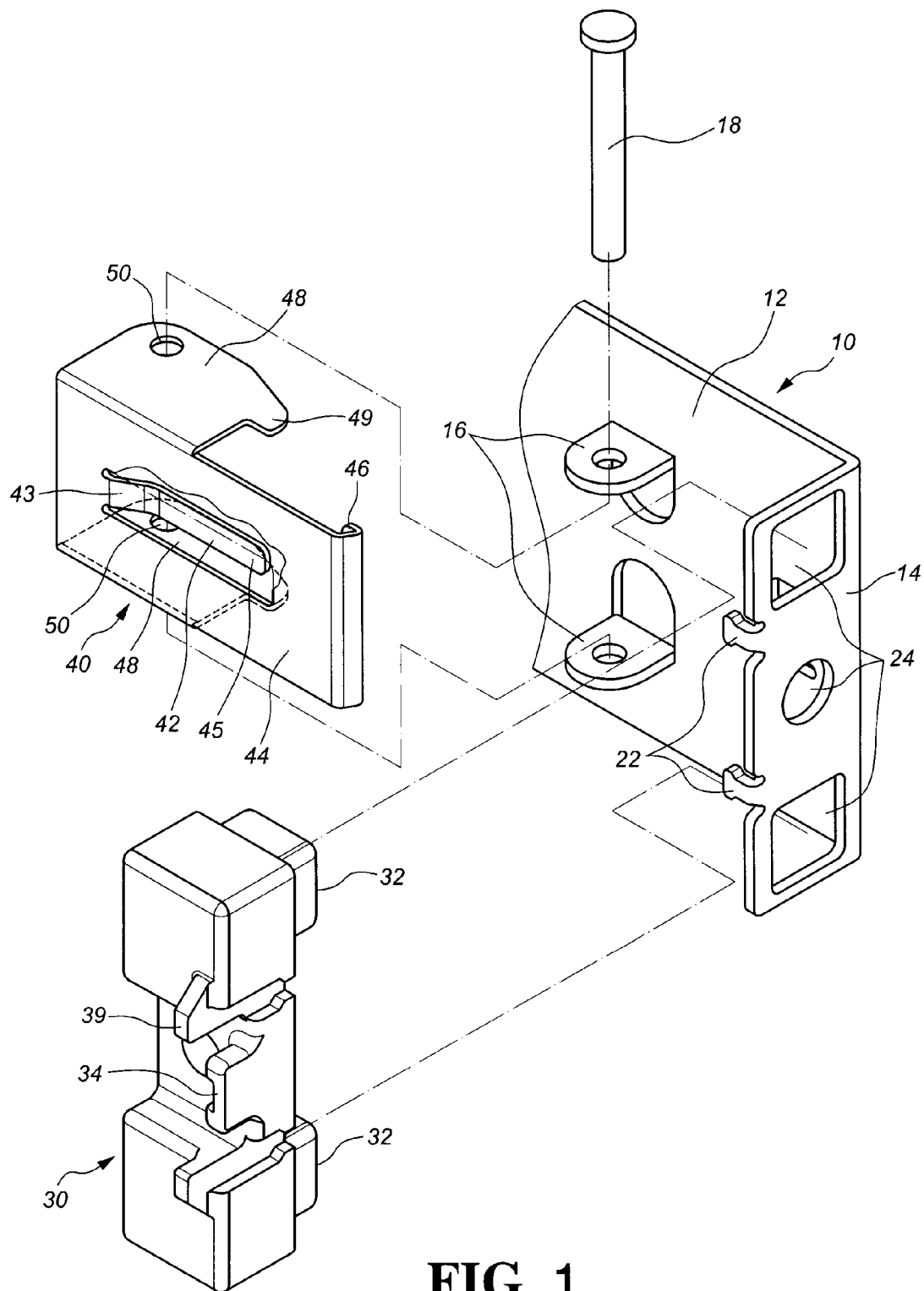
FIG. 1 is an exploded view of a bracket assembly according to a first embodiment of the present invention.
Figure 2:
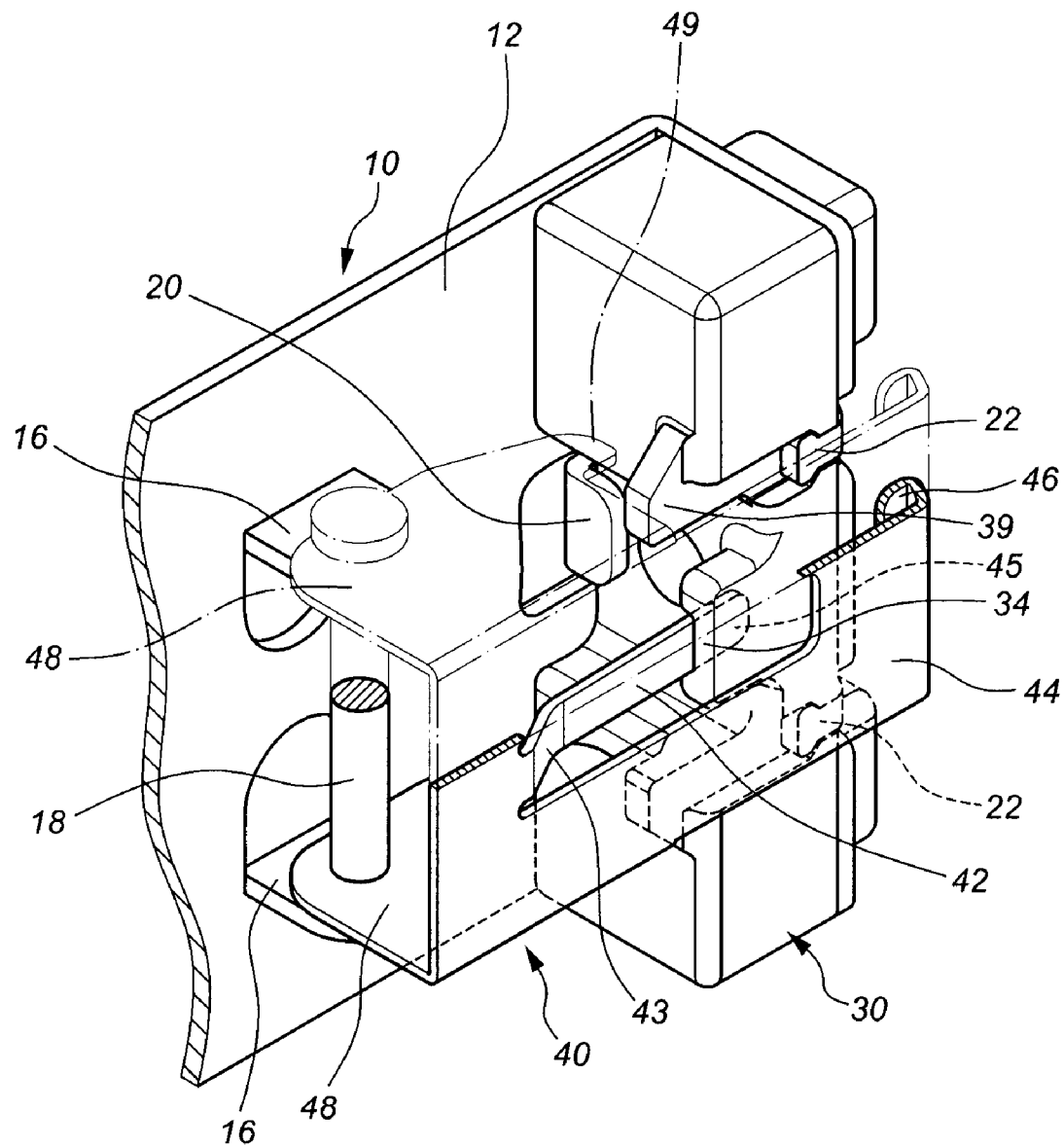
FIG. 2 a schematic view showing the connection of the parts of the bracket assembly according to the first embodiment of the present invention.

Referring to FIGS. 1 and 2, a bracket assembly according to a first embodiment of the present invention comprises a bracket 10, a base 30, and a fastening member 40.

Figure 3:
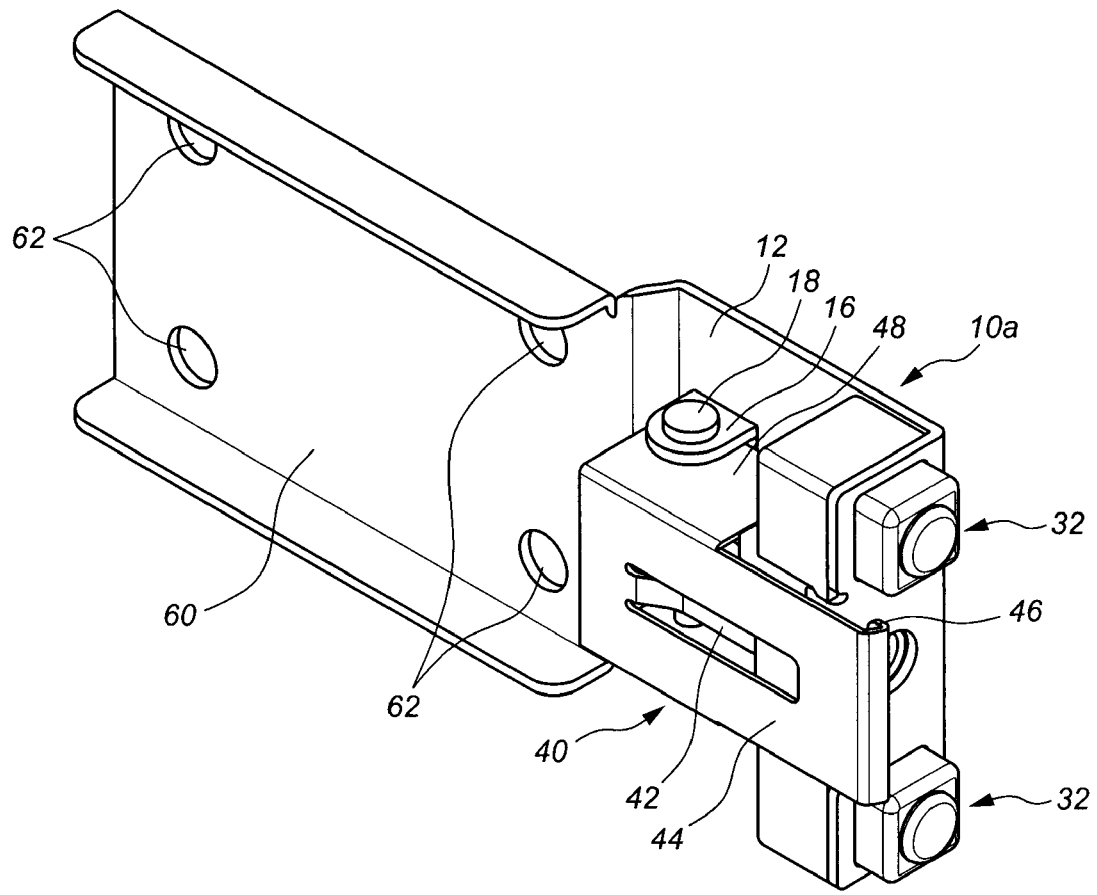
FIG. 3 is a perspective view showing a first bracket of the bracket assembly according to the first embodiment of the present invention.
Figure 4:
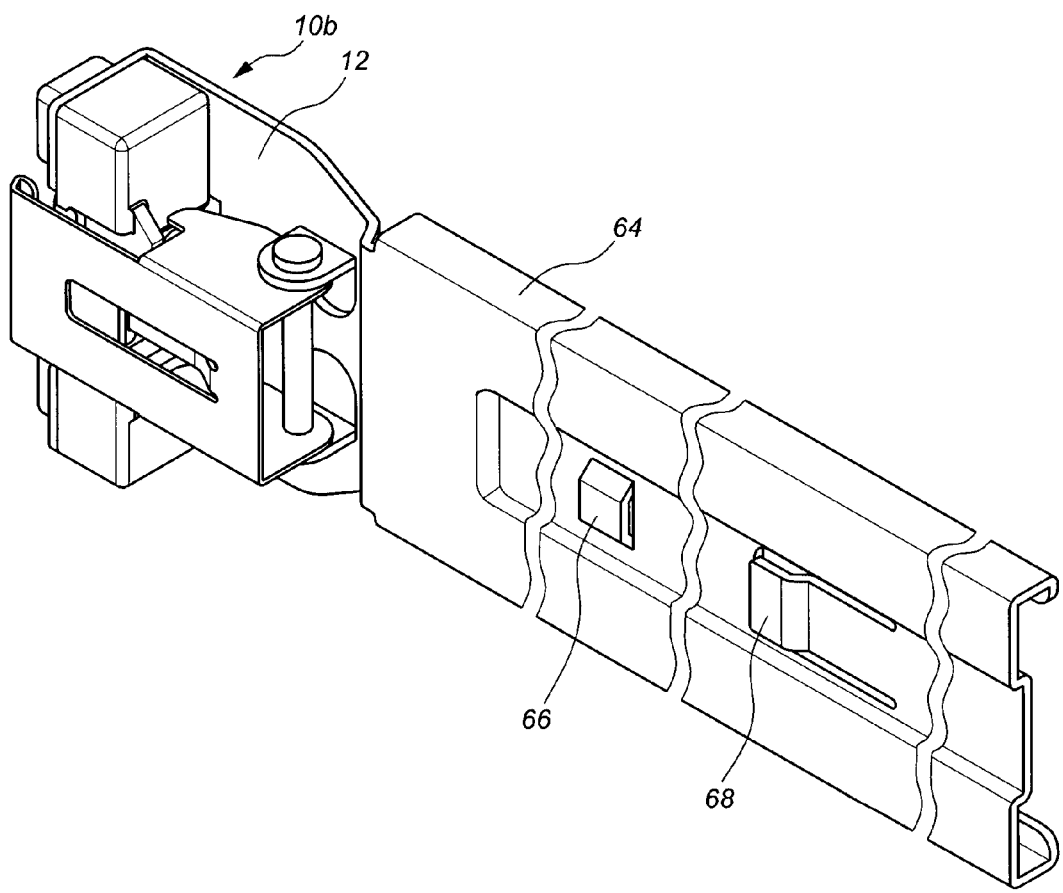
FIG. 4 is a perspective view showing a second bracket of the bracket assembly according to the first embodiment of the present invention.

The bracket 10 includes a first plate 12 and a second plate 14 which is substantially extending vertically from an end of the first plate 12. The first plate 12 includes two lugs 16, a pin 18 penetrating through the two lugs 16, and a first engaging portion 20 extending from the first plate 12, as shown in FIG. 2. The second plate 14 includes two second engaging portions 22 and a plurality of bracket holes 24. In this embodiment, the bracket holes 24 include rectangular holes and circular holes. As shown in FIGS. 3 and 4, the bracket 10 includes a first bracket 10a and a second racket 10b which have the same configuration as the bracket 10.

The base 30 is securely connected to the bracket 10. The base 30 includes a plurality of connection members 32 corresponding to the bracket holes 24. In this embodiment, at least one of the connection members 32 corresponds to at least one of the bracket holes 24. The base 30 further includes a first stop 34 and a second stop 39. As shown in FIG. 2, the base 30 is firmly connected to the bracket 10 by the first and second engaging portions 20, 22 of the bracket 10. In this embodiment, the second stop 39 is a protrusion and the first stop 34 is a protrusion too.

The fastening member 40 is pivotally connected to the bracket 10. The fastening member 40 includes a resilient leg 42 and a fastening arm 44 which extends from the fastening member 40. The resilient leg 42 includes a fixing end 43 and a free end 45. The fixing end 43 is connected to the fastening member 40. The resilient leg 42 extends to the first stop 34 and the free end 45 of the resilient leg 42 leans on the first stop 34. The fastening arm 44 has at least one fastening portion 46 bending from the fastening arm 44, and the fastening portion 46 extends beyond the second plate 14. The resilient leg 42 provides a force to return the fastening portion 46 back to its original position. The fastening member 40 includes two spaced connection plates 48 which have pivotal holes 50. The pin 18 inserts through the lugs 16 and the pivotal holes 50 to connect the fastening member 40 to the lugs 16. Two contact parts 49 respectively extend from the two connection plates 48 and are located corresponding to the second stop 39 of the base 30 so as to restrict the operating angle of the fastening arm 44. In this embodiment, the resilient leg 42 extends from the fastening member 40 or is a resilient member connected to the fastening member 40.

In this embodiment, as shown in FIG. 3, the first bracket 10a includes a first extension plate 60 which has a plurality of connection holes 62. The first plate 12 of the first bracket 10a extends from the first extension plate 60, and the first bracket 10a is used as a front bracket.

In this embodiment, as shown in FIG. 4, the second bracket 10b includes a second extension plate 64 which has two spaced first and second blocks 66, 68. The first plate 12 of the second bracket 10b extends from the second extension plate 64, and the second bracket 10b is used as a rear bracket.

Figure 5:
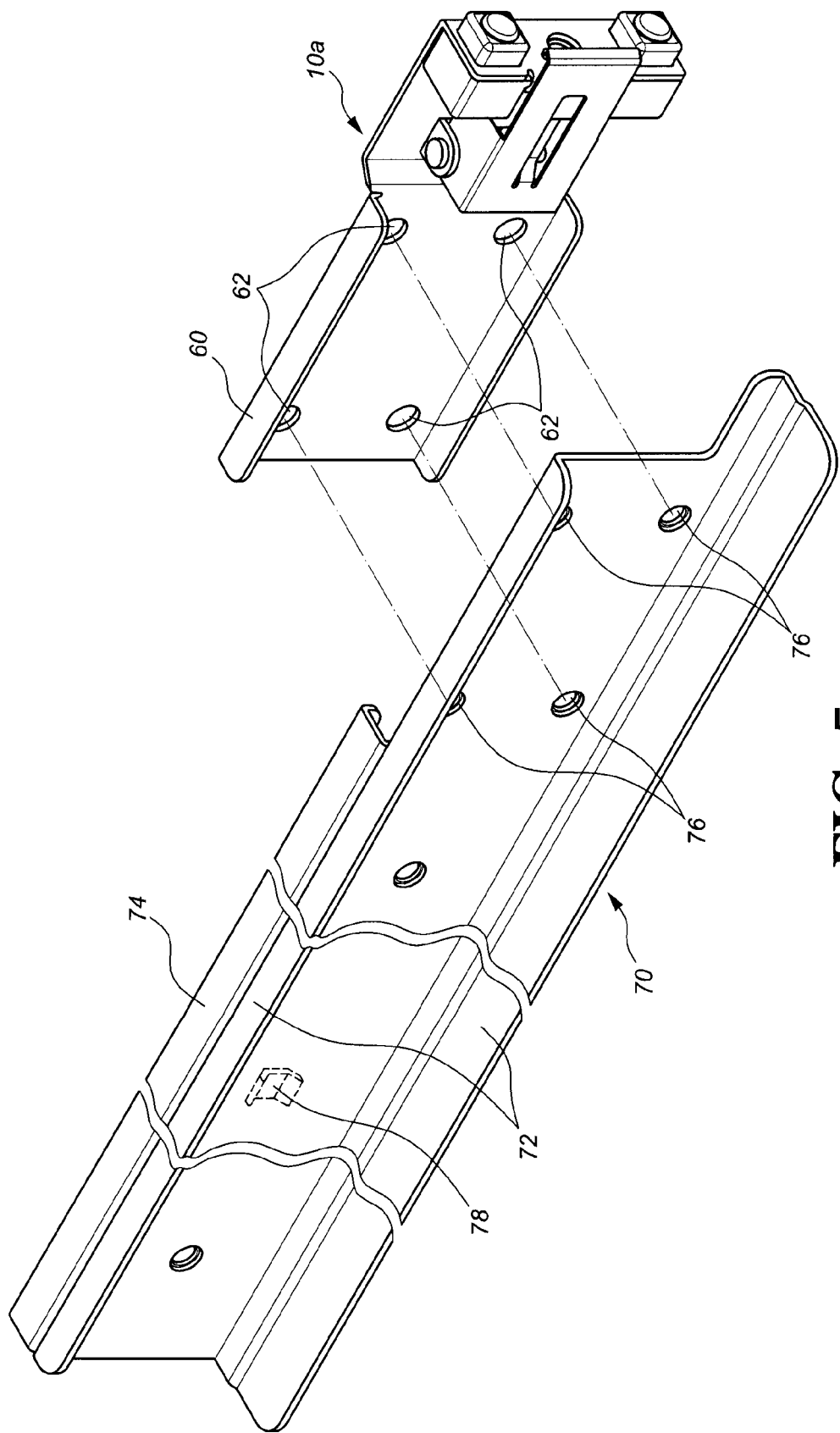
FIG. 5 is an exploded view showing the first bracket and a support frame assembly according to the first embodiment of the present invention.
Figure 6:
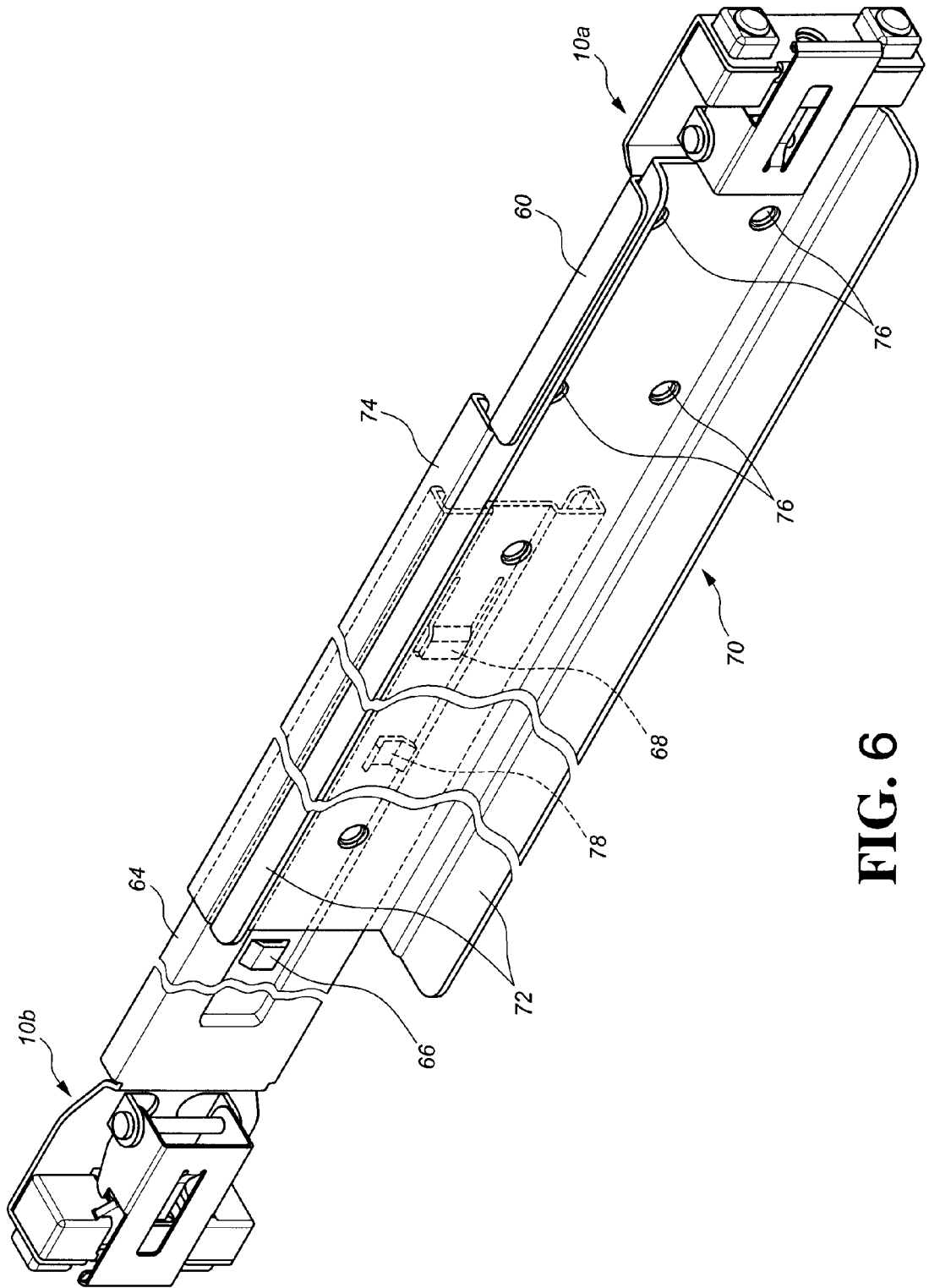
FIG. 6 is a perspective view showing the support frame assembly connected between the first and second brackets according to the first embodiment of the present invention.
Figure 7:
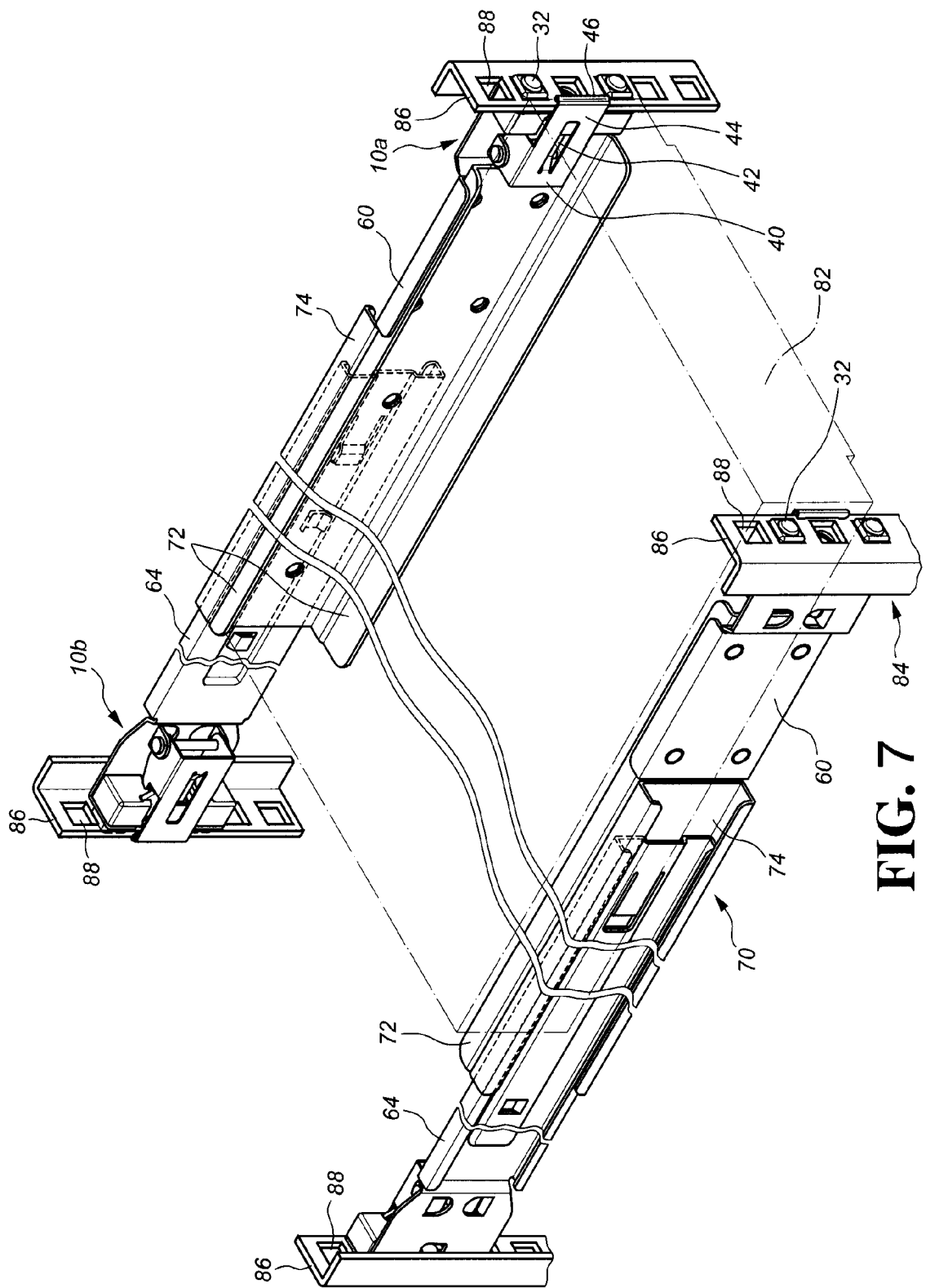
FIG. 7 is a schematic view showing a load member supported by the support frame assembly which is connected with the first and second brackets according to the first embodiment of the present invention.

As shown in FIG. 5, a support frame assembly 70 includes a first support frame 72 and a second support frame 74. The first support frame 72 includes a first support portion which has a plurality of connection pieces 76 corresponding in position to the connection holes 62 of the first extension plate 60 for connecting with the first extension plate 60 by way of riveting. The second extension plate 64 of the second bracket 10b (rear bracket) is movably connected to the second support frame 74 of the support frame assembly 70, as shown in FIG. 6. In this embodiment, the second support frame 74 includes a stop member 78 by which the first and second blocks 66, 68 of the second extension plate 64 are stopped to restrict the travel distance of the second extension plate 64 relative to the second support frame 74. The first and second support frames 72, 74 each have a C-shaped cross section and are connected back to back to each other. In this embodiment, the first support frame 72 is adapted to support a load member 82, as shown in FIG. 7.

Figure 8:
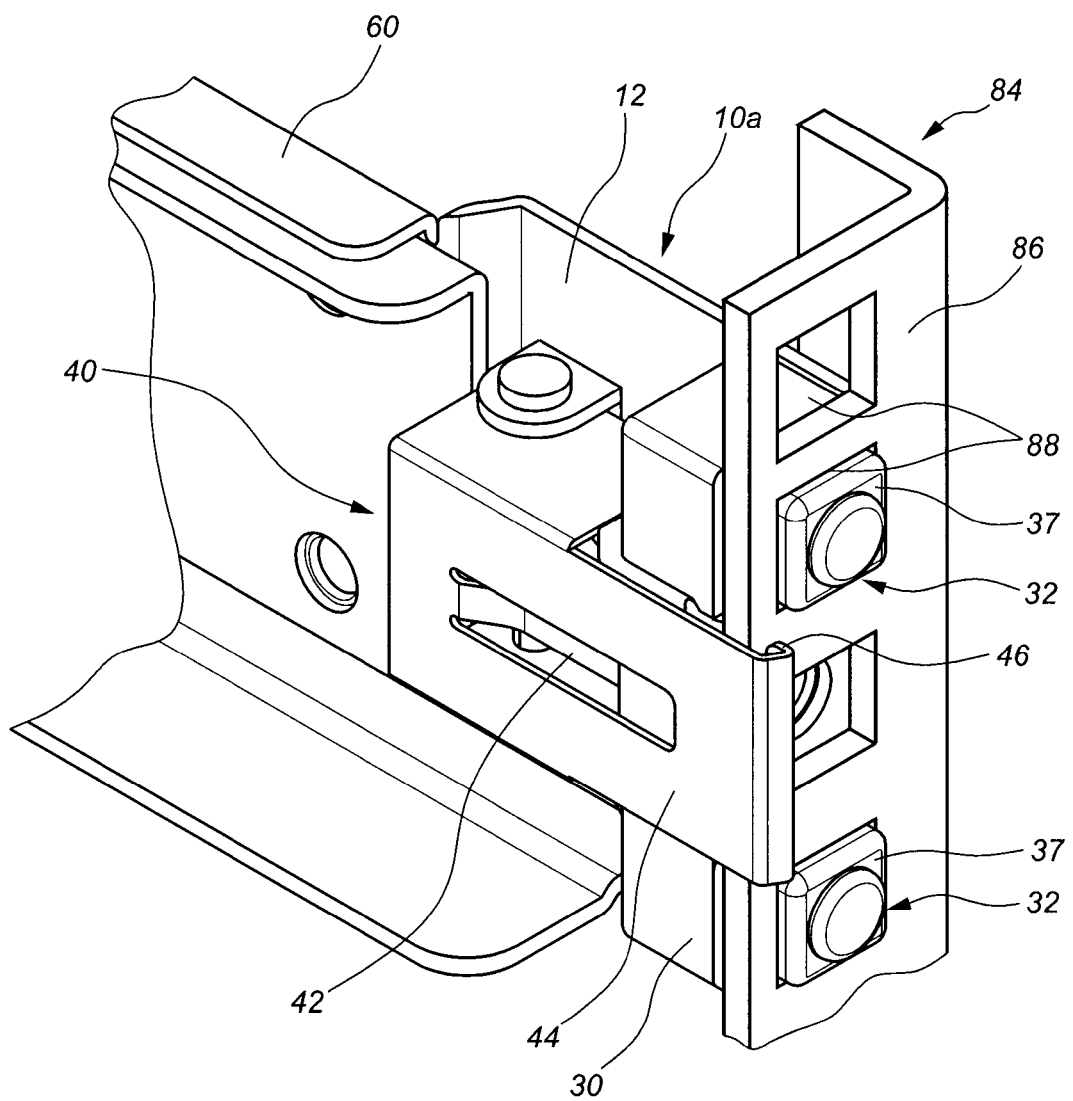
FIG. 8 is a schematic view showing the connection of a post having rectangular holes and the first bracket according to the first embodiment of the present invention.
Figure 9:
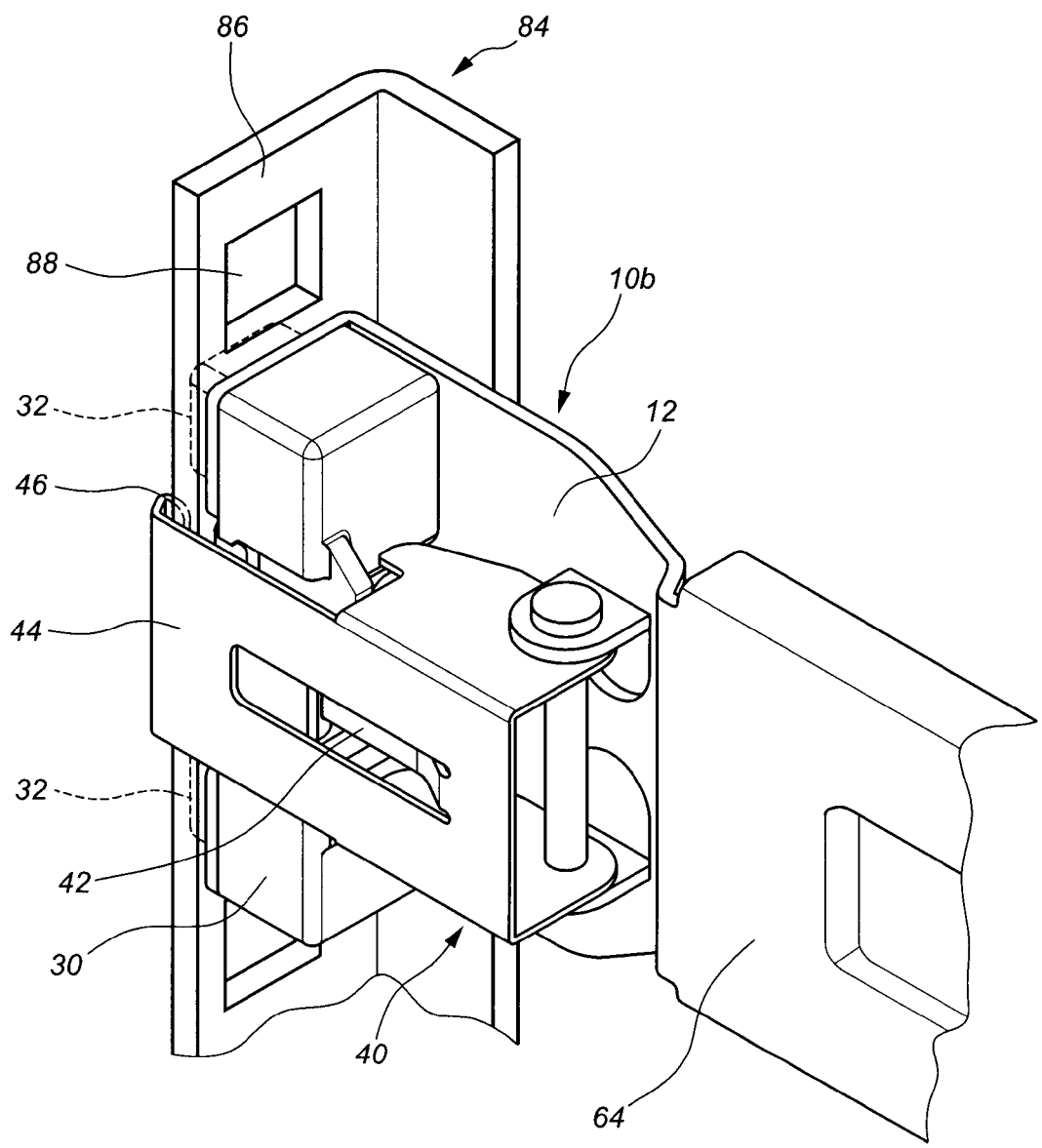
FIG. 9 is a schematic view showing the connection of a post having rectangular holes and the second bracket according to the first embodiment of the present invention.

A rack 84 includes multiple posts 86 each having multiple holes 88 which may be rectangular holes or circular holes. In this embodiment, the holes 88 are rectangular holes. As shown in FIGS. 7 and 8, a pair of the support frame assemblies 70 support the load member 82 and each support frame assembly 70 includes a first support frame 72 and a second support frame 74, wherein the first support frame 72 is connected to the first extension plate 60 of the first bracket 10a and the second support frame 74 is connected to the second extension plate 64 of the second bracket 10b. The connection members 32 of the base 30 extend through the holes 88 of one of the posts 86. With the resilient leg 42 leaning against the base 30, the fastening arm 44 of the fastening member 40 provides a force to hook the fastening portion 46 to the one of the posts 86. Similarly, the second bracket 10b is connected to another one of the posts 86 by the connection members 32 of the base 30, and the connection members 32 of the base 30 extend through the holes 88 of the another one of the posts 86. With the resilient leg 42 leaning against the base 30, the fastening arm 44 of the fastening member 40 provides a force to hook the fastening portion 46 to the another one post 86, as shown in FIG. 9.

Figure 10:
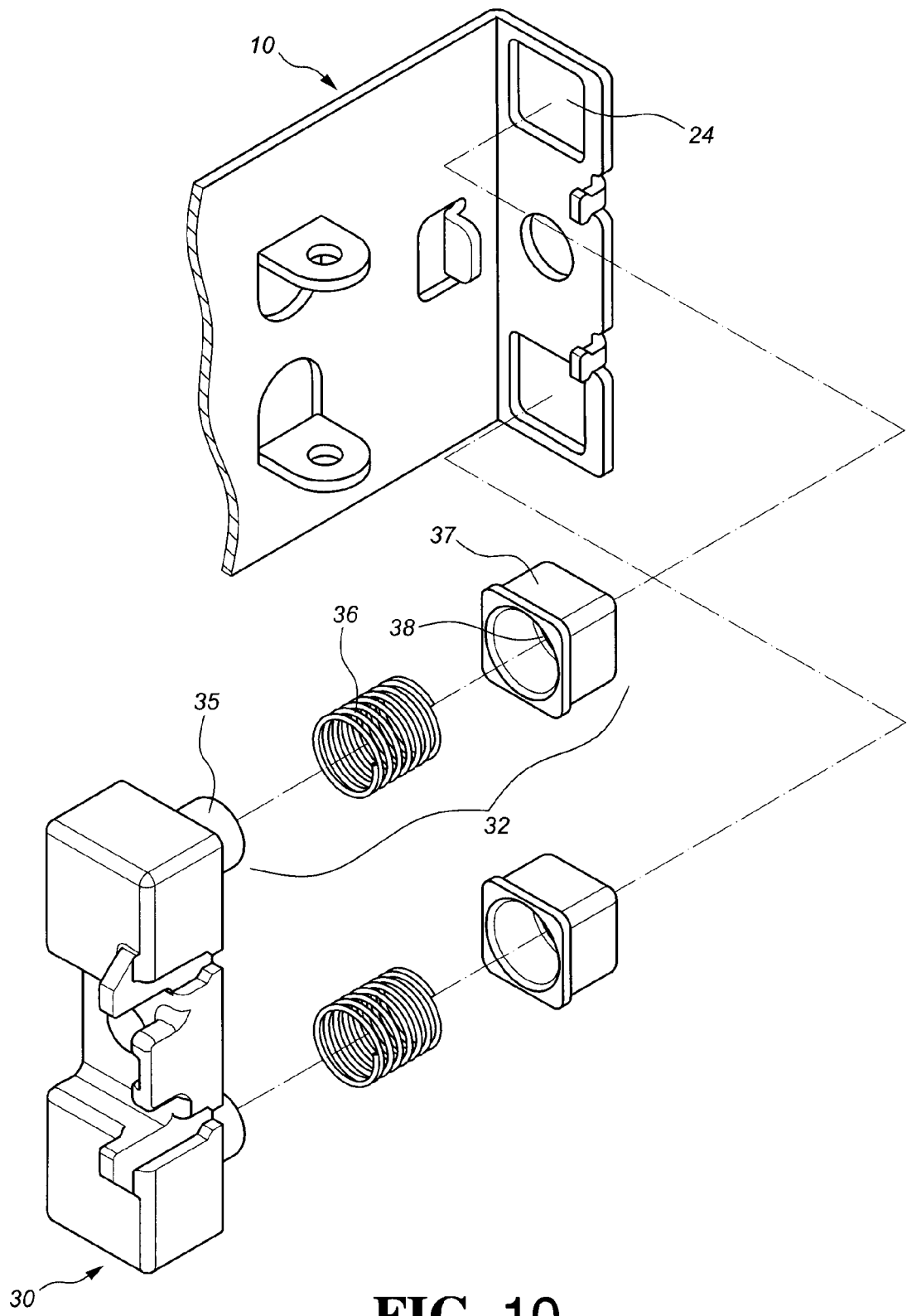
FIG. 10 is an exploded view showing a connection member of a base and the bracket according to the first embodiment of the present invention.
Figure 11:
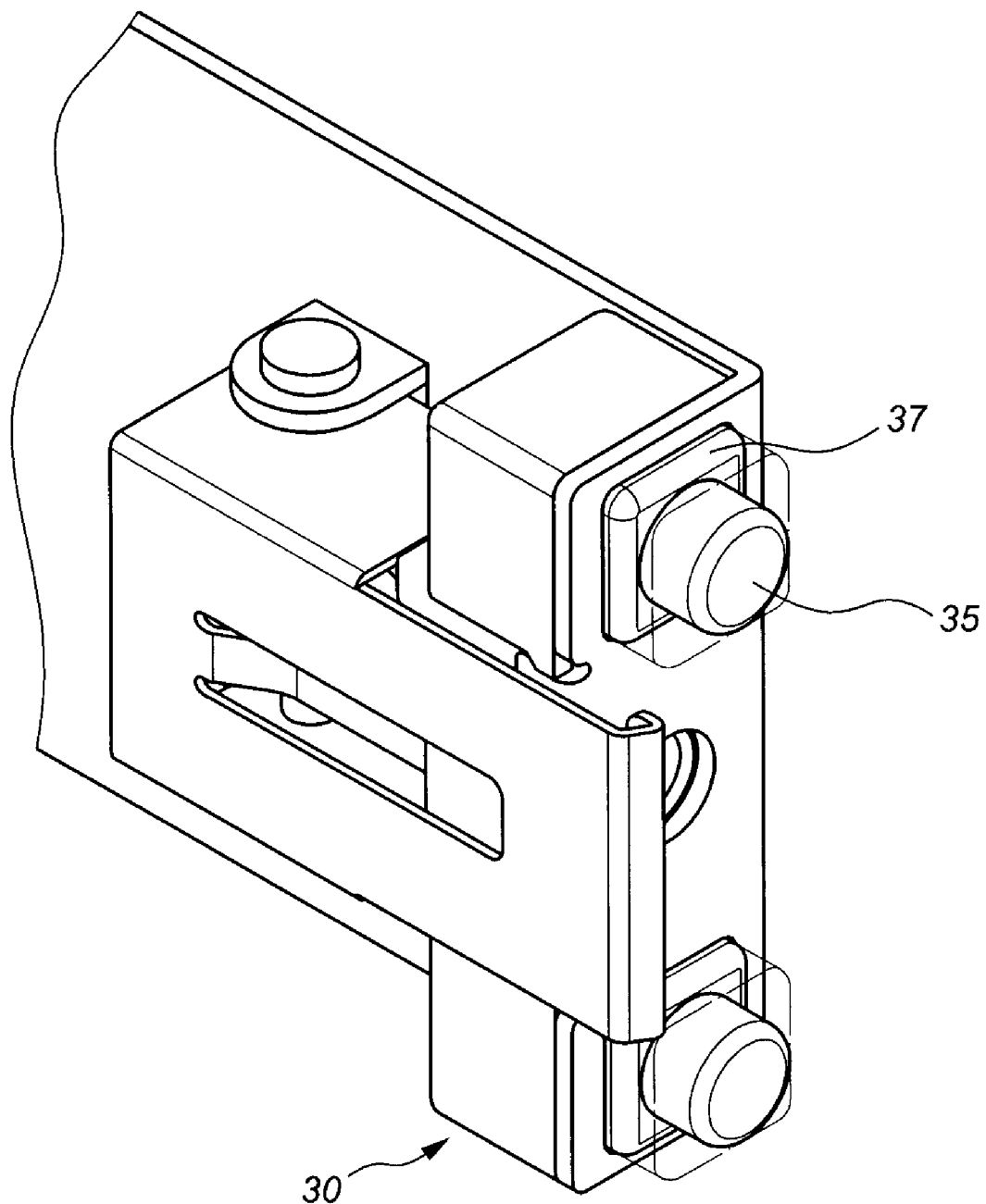
FIG. 11 is a perspective view showing the base connected with the bracket and the fastening member according to the first embodiment of the present invention.
Figure 12:
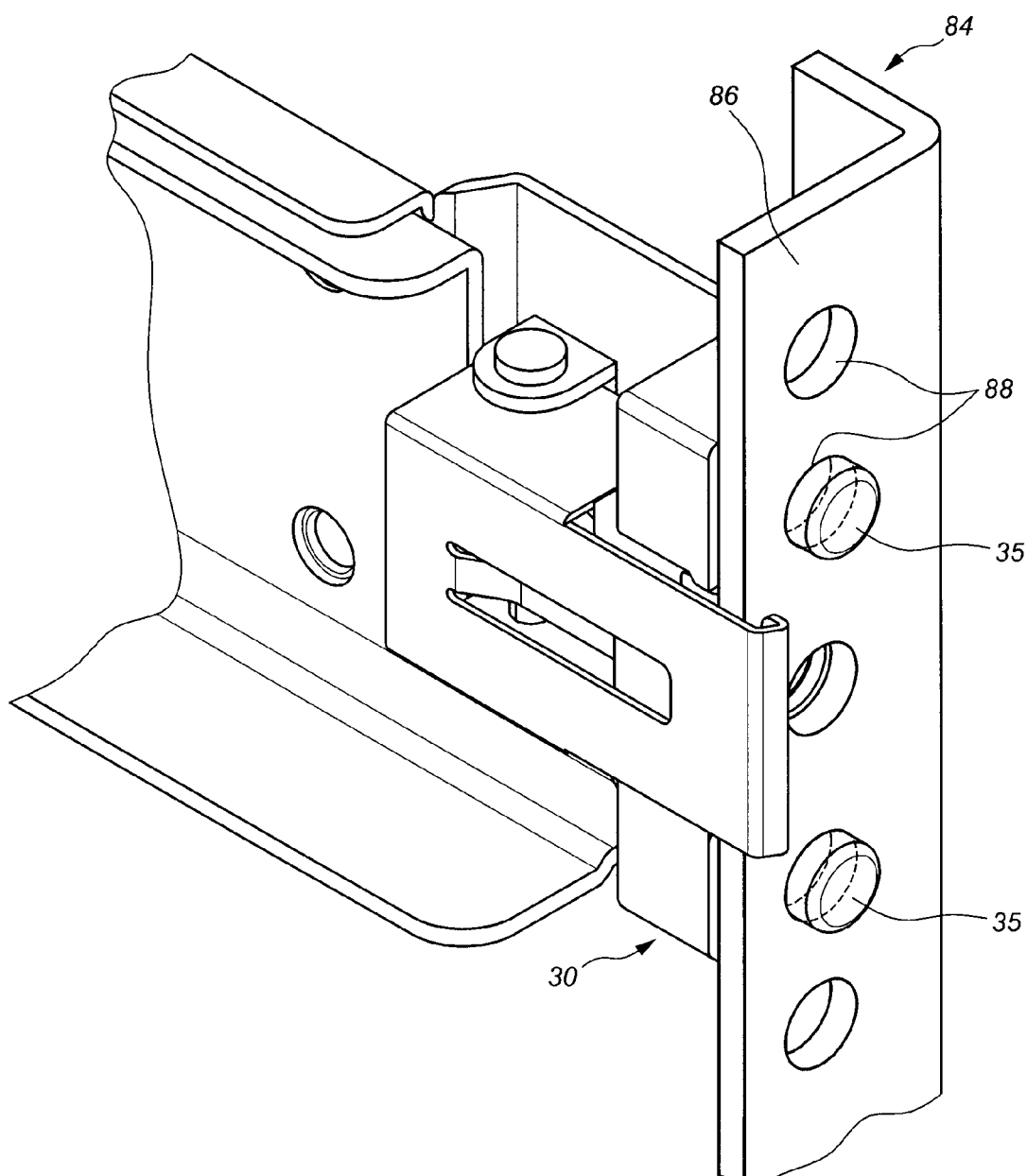
FIG. 12 a perspective view showing the connection of the post having circular holes and the base according to the first embodiment of the present invention.

FIGS. 10 and 11 show that each of the connection members 32 of the base 30 includes a protrusion 35, a mounting piece 37 movably mounted to the protrusion 35 and inserted in the bracket hole 24 of the bracket 10, and a spring 36 disposed between the protrusion 35 and the mounting piece 37. The mounting piece 37 has a through hole 38. The protrusion 35 extends through the through hole 38. The mounting pieces 37 movably extend through the bracket holes 24 of the bracket 10. The mounting pieces 37 and the bracket holes 24 can be made as rectangular or circular, and the holes 88 of the posts 86 are also made according to the shapes of the mounting pieces 37 and the bracket holes 24. FIG. 8 shows that the shapes of the mounting pieces 37, the bracket holes 24 and the holes 88 are rectangular, and FIG. 12 shows that they are circular.

Figure 13:
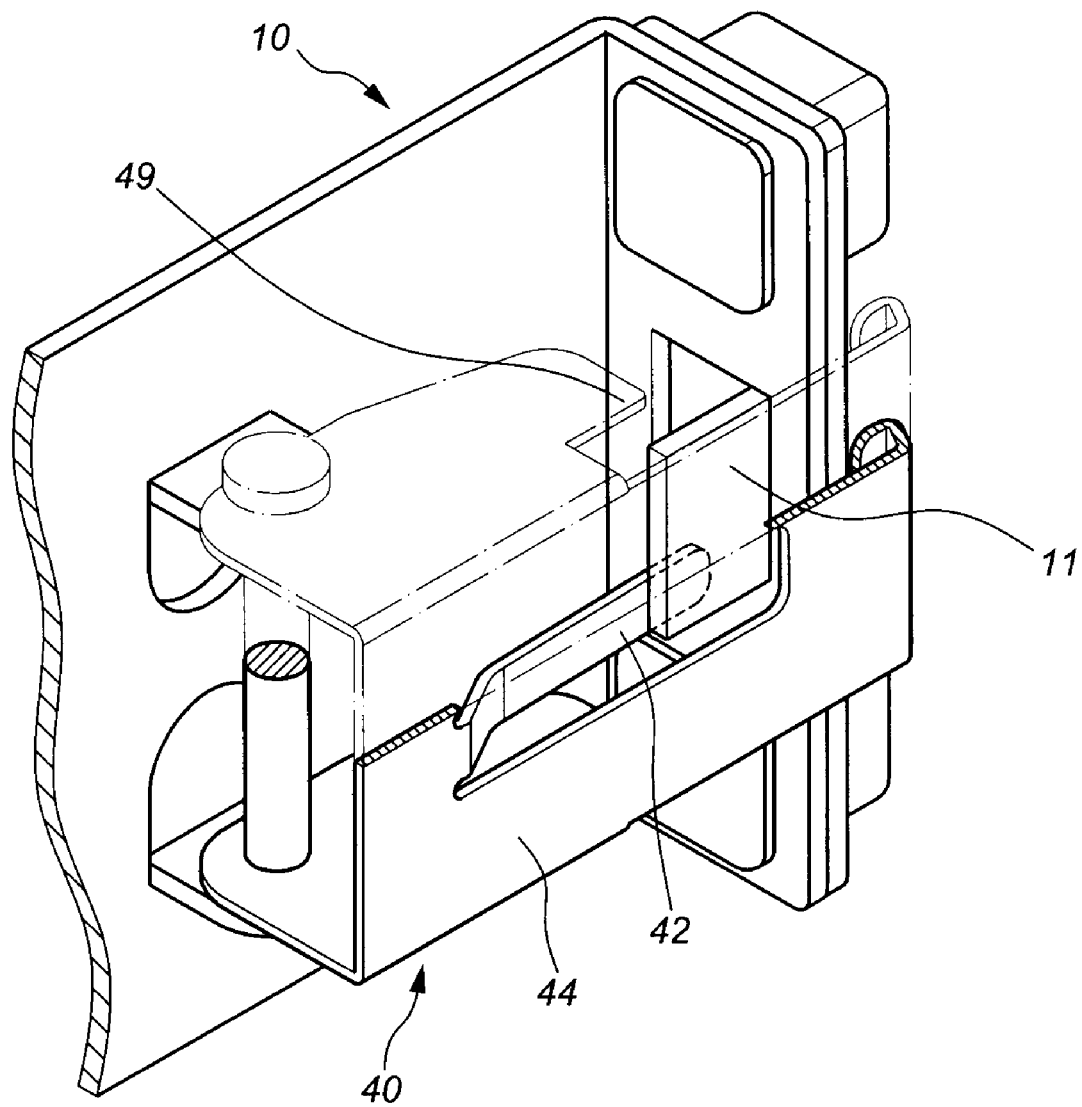
FIG. 13 is a schematic view showing a resilient leg of a fastening member leaning on the bracket according to a second embodiment of the present invention.

As shown in FIG. 13, the bracket 10 includes a stop plate 11 and the free end 45 of the resilient leg 42 of the fastening member 40 leans on the stop plate 11 so as to maintain a force to return the fastening arm 44. The stop plate 11 is located corresponding to the contact parts 49 of the fastening member 40 so as to restrict the operation angle that the fastening arm 44 of the fastening member 40.

Figure 14:
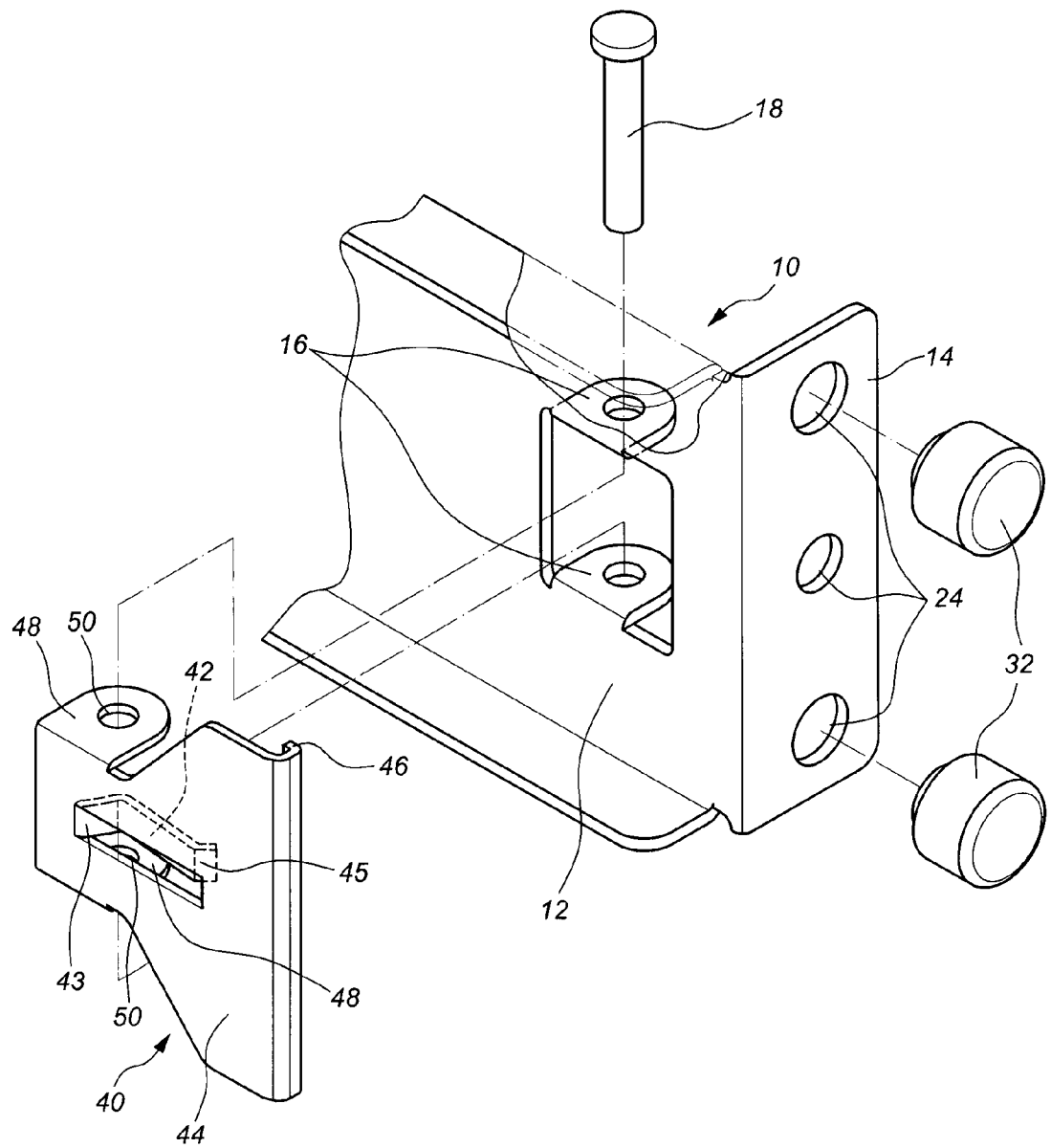
FIG. 14 is an exploded view showing the bracket assembly according to a third embodiment of the present invention.
Figure 15:
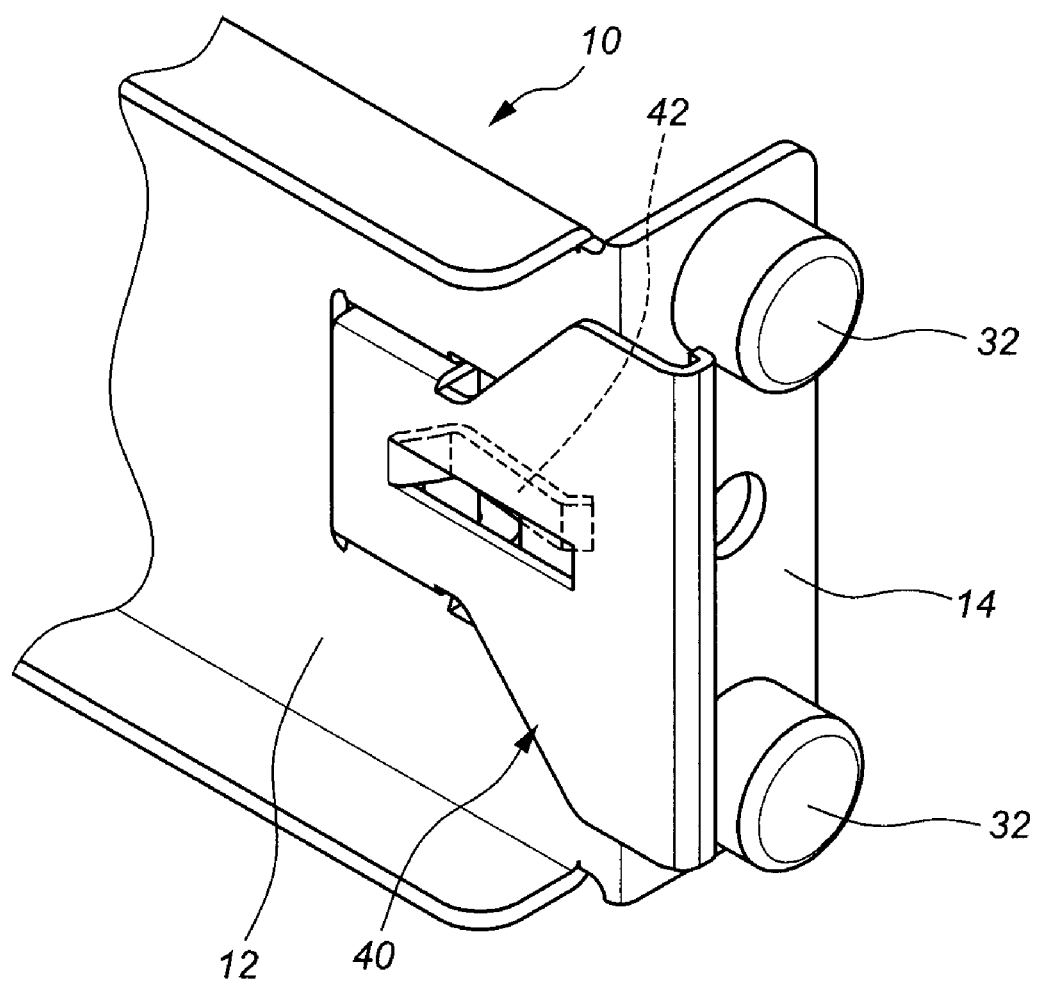
FIG. 15 is a perspective view showing the bracket assembly according to the third embodiment of the present invention.

Referring to FIGS. 14 and 15, a bracket assembly according to a third embodiment of the present invention comprises a bracket 10, a plurality of connection members 32, and a fastening member 40.

Figure 16:
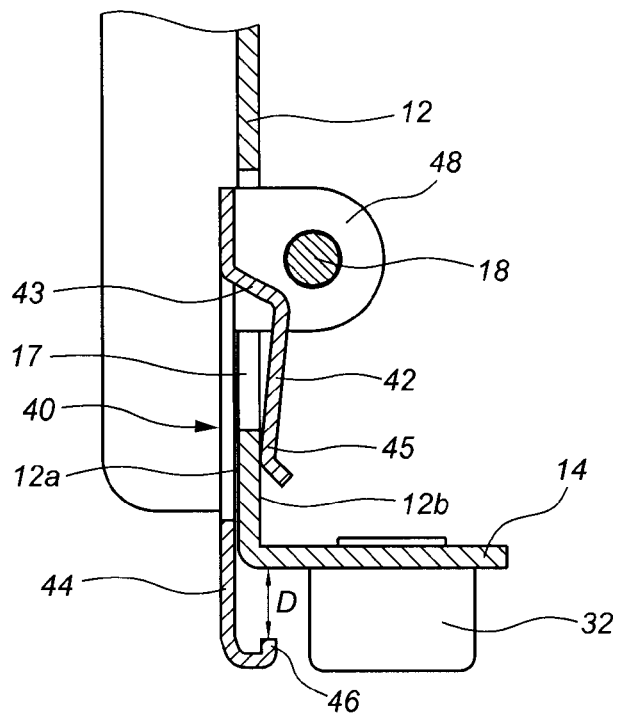
FIG. 16 is a cross-sectional view showing a first type of resilient leg according to the third embodiment of the present invention.

The bracket 10 includes a first plate 12 and a second plate 14 which extends from an end of the first plate 12. The first plate 12 includes two lugs 16 and a pin 18 penetrating through the two lugs 16. The second plate 14 includes a plurality of bracket holes 24 thereon. At least one of the connection members 32 is located corresponding to at least one of the bracket holes 24. The fastening member 40 is pivotally connected to the first plate 12 of the bracket 10. The fastening member 40 includes a resilient leg 42 and a fastening arm 44 extending from the fastening member 40. The resilient leg 42 includes a fixing end 43 and a free end 45. The fixing end 43 of the resilient leg 42 is fixed to the fastening member 40 and the free end 45 of the resilient leg 42 leans on the bracket 10. In this embodiment, the first plate 12 is formed with an opening 17 disposed between the two lugs 16, as shown in FIG. 16. The fastening member 40 includes two spaced connection plates 48 which have pivotal holes 50. The connection plates 48 extend through the opening 17 and the pin 18 inserts through the lugs 16 and the pivotal holes 50 of the connection plates 48. The fastening arm 44 has at least one fastening portion 46 which bends from one end of the fastening arm 44. The fastening portion 46 extends beyond the second plate 14 of the bracket 10, and a distance "D" is defined between the fastening portion 46 and the second plate 14, as shown in FIG. 16. The fastening portion 46 has a tendency to return back to its original position by the resilient leg 42. In this embodiment, the first plate 12 of the bracket 10 includes a first side 12a and a second side 12b, and the opening 17 penetrates through the first and second sides 12a, 12b. The resilient leg 42 extends through the opening 17 and the free end 45 of the resilient leg 42 leans on the second side 12b so that the fastening member 40 returns back to its original position by the resilient leg 42. In this embodiment, the resilient leg 42 is integrally formed with the fastening member 40, which may be separate from the fastening member 40. The fastening member 40 includes a fixing portion 41, and the fixing end 43 of the resilient leg 42 is fixedly mounted to the fixing portion 41, as shown in FIG. 17.

Figure 17:
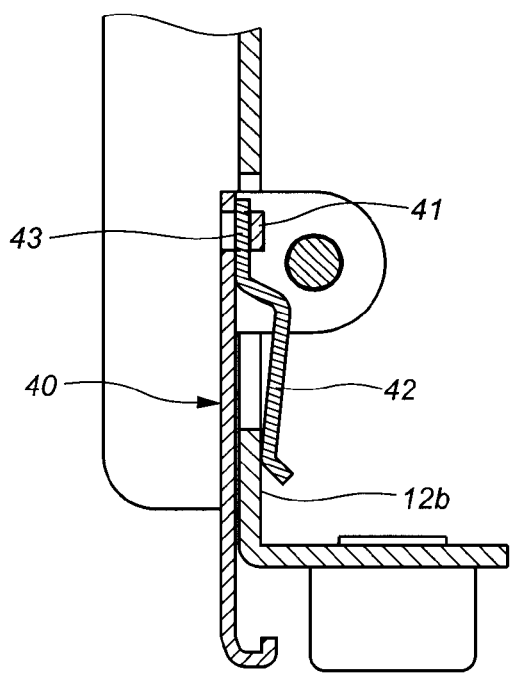
FIG. 17 is a cross-sectional view showing a second type of resilient leg according to the third embodiment of the present invention.
Figure 18:
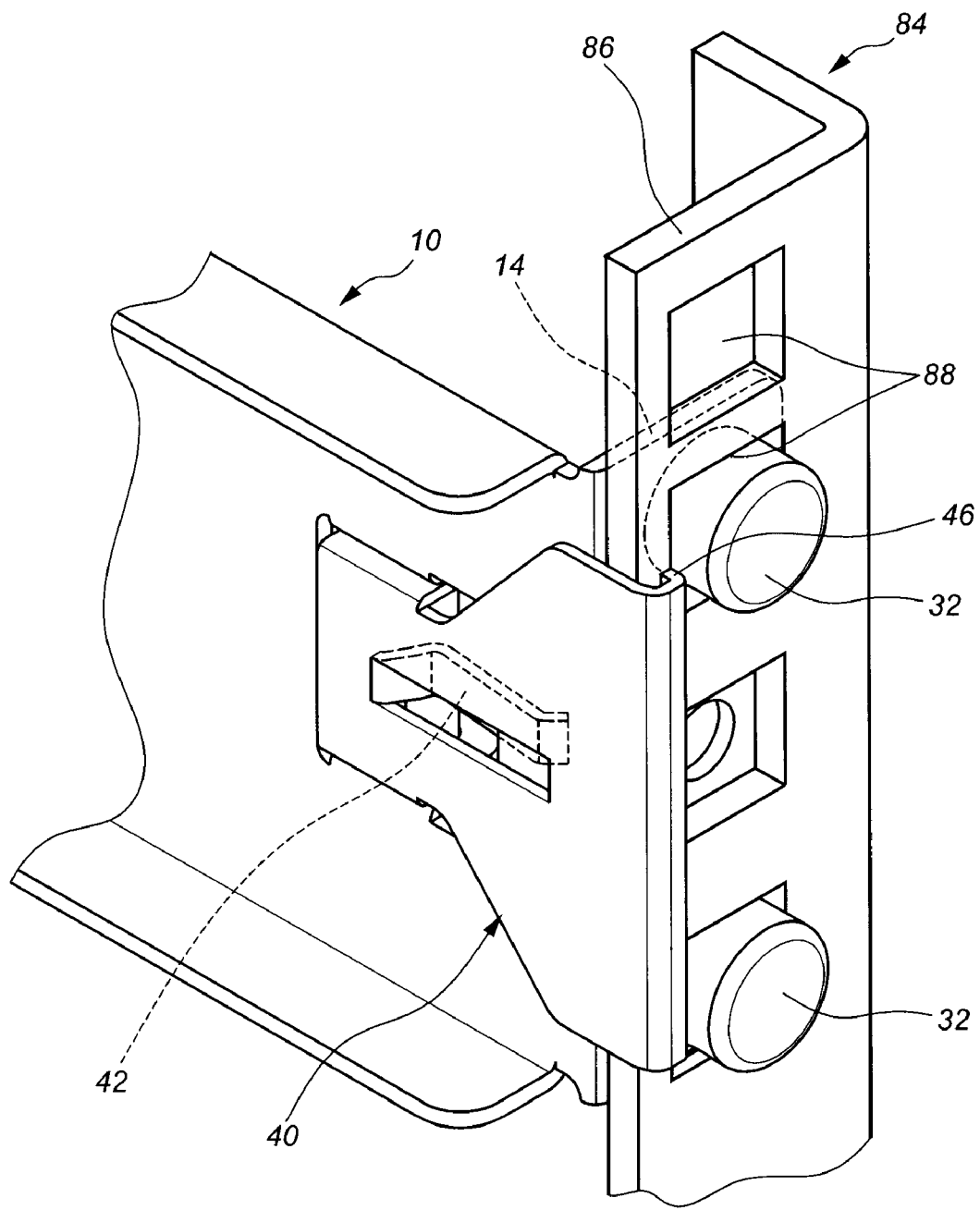
FIG. 18 is a perspective view showing the bracket assembly mounted to the post according to the third embodiment of the present invention.

As shown in FIG. 18, the connection members 32 extend through the holes 88 of one of the posts 86, and the resilient leg 42 of the fastening member 40 leans on the second side 12b of the first plate 12 of the bracket 10, as shown in FIGS. 16 and 17. The fastening arm 44 of the fastening member 40 provides a return force and the fastening portion 46 of the fastening arm 44 hooks to the one post 86 which is connected between the fastening portion 46 and the second plate 14 so as to firmly fix the bracket 10 to the one post 86.

While we have shown and described the embodiment in accordance with the present invention, it should be clear to those skilled in the art that further embodiments may be made without departing from the scope of the present invention.

What is claimed is:

1. A combination of a rack and a bracket assembly, wherein the rack includes a plurality of posts and at least a pair of support frame assemblies, each of the posts having a plurality of holes, each of the support frame assembly including a first support frame and a second support frame, the first support frame being fixed to a first extension plate and the second support frame being movably connected to a second extension plate, the first and second extension plates being respectively connected to the bracket assembly, the bracket assembly comprising:
   a bracket having a plurality of bracket holes;
   a base connected to the bracket, the base including a plurality of connection members, at least one of the connection members corresponding to at least one of the bracket holes; and
   a fastening member pivotally connected to the bracket, the fastening member including a resilient leg and a fastening arm extending from the fastening member, the fastening arm having at least one fastening portion which bends from the fastening arm, the fastening portion extending beyond the bracket, the resilient leg including a fixing end fixed to the fastening member and a free end leaning on the bracket or the base;
   wherein at least one of the connection members of the base is connected to at least one of the holes of the rack;
   wherein the fastening portion of the fastening arm of the fastening member is hooked to one of the posts of the rack.

2. A bracket assembly, comprising:
   a bracket including a first plate and a second plate extending from an end of the first plate, the second plate having a plurality of bracket holes;
   a base connected to the bracket, the base having a plurality of connection members, at least one of the connection members corresponding to at least one of the bracket holes;
   a fastening member pivotally connected to the bracket, the fastening member including a resilient leg and a fastening arm extending from the fastening member, the fastening arm having at least one fastening portion bending from the fastening arm, the fastening portion extending beyond the second plate, the resilient leg including a fixing end fixed to the fastening member and a free end leaning on the bracket or the base; and, a support frame assembly which includes a first support frame and a second support frame, the first support frame including a first support portion for connecting with a first extension plate, the second support frame supporting a load member and being connected to a second extension plate, the second support frame including a stop member, the second extension plate including a first block and a second block which is spaced away from the first block, the stop member being located between the first and second blocks and stopped by one of the first and second blocks.

3. The bracket assembly as claimed in claim 2, wherein the first and second support frames each have a C-shaped cross section and are connected back to back to each other.

4. The bracket assembly as claimed in claim 2, wherein the bracket includes two lugs, the fastening member includes two spaced connection plates which have pivotal holes, and a pin extends through the lugs and the pivotal holes to connect the fastening member to the lugs.

5. The bracket assembly as claimed in claim 2, wherein the bracket includes a first engaging portion extending from the first plate and the second plate includes two second engaging portions, the first engaging portion and the two second engaging portions of the bracket being adapted to position the base.

6. The bracket assembly as claimed in claim 2, wherein each of the connection members of the base includes a protrusion, a mounting piece movably mounted to the protrusion and a spring disposed between the protrusion and the mounting piece, wherein the mounting piece has a through hole and the protrusion extends through the through hole.

7. The bracket assembly as claimed in claim 2, wherein the base includes a first stop and a second stop, the resilient leg of the fastening member extending to the first stop of the base, the free end of the resilient leg leaning on the first stop, the fastening member including a contact part corresponding to the second stop of the base.

* * * * *